United States Patent
Zhang

(10) Patent No.: US 11,374,185 B2
(45) Date of Patent: Jun. 28, 2022

(54) FLEXIBLE DISPLAY PANEL, FLEXIBLE DISPLAY DEVICE, AND MANUFACTURING METHOD OF FLEXIBLE DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Tao Zhang, Hubei (CN)

(73) Assignee: WUHAN CHINA STAR OPTOELECTRONICS SEMICONDUCTOR DISPLAY TECHNOLOGIES CO., LTD., Hubei (CN)

( * ) Notice: Subject to any disclaimer, the term of this patent is extended or adjusted under 35 U.S.C. 154(b) by 139 days.

(21) Appl. No.: 16/964,212

(22) PCT Filed: Mar. 31, 2020

(86) PCT No.: PCT/CN2020/082415
§ 371 (c)(1),
(2) Date: Jul. 23, 2020

(87) PCT Pub. No.: WO2021/103369
PCT Pub. Date: Jun. 3, 2021

(65) Prior Publication Data
US 2021/0159433 A1    May 27, 2021

(30) Foreign Application Priority Data

Nov. 26, 2019    (CN) .......................... 201911172256.X

(51) Int. Cl.
*H01L 51/00* (2006.01)
*H01L 51/52* (2006.01)
*H01L 51/56* (2006.01)

(52) U.S. Cl.
CPC ........ *H01L 51/0097* (2013.01); *H01L 51/525* (2013.01); *H01L 51/56* (2013.01)

(58) Field of Classification Search
None
See application file for complete search history.

(56) References Cited

U.S. PATENT DOCUMENTS

2018/0083218 A1    3/2018    Choi et al.
2019/0259974 A1    8/2019    Samsung
(Continued)

FOREIGN PATENT DOCUMENTS

CN    108615822 A    10/2018
CN    108638621 A    10/2018
(Continued)

OTHER PUBLICATIONS

Machine translation of CN-109285964-A (Year: 2019).*

*Primary Examiner* — J. E. Schoenholtz
(74) *Attorney, Agent, or Firm* — Mark M. Friedman

(57) ABSTRACT

The present invention provides a flexible display panel, a flexible display device, and a manufacturing method of the flexible display panel. The flexible display panel is used as a protective cover of the flexible display device. The flexible display panel includes a flexible substrate, organic pixel units, a first inorganic layer, a spacer, an organic layer, and a second inorganic layer. The organic pixel units are disposed in an array on a side of the flexible substrate. The first inorganic layer covers a side of the organic pixel units away from the flexible substrate. The spacer is disposed on a side of the first inorganic layer away from the flexible substrate, wherein the spacer is provided with a plurality of through holes. The flexible display panel of the present invention not only has high flexibility and bendability but also has strong water and oxygen barrier capabilities.

14 Claims, 7 Drawing Sheets

(56) References Cited

U.S. PATENT DOCUMENTS

| | | |
|---|---|---|
| 2019/0273221 A1 | 9/2019 | Liu et al. |
| 2019/0354140 A1* | 11/2019 | Park .................... H01L 51/5246 |
| 2020/0335719 A1 | 10/2020 | Xu et al. |
| 2021/0066419 A1* | 3/2021 | Byun ...................... H01L 51/56 |

FOREIGN PATENT DOCUMENTS

| | | | |
|---|---|---|---|
| CN | 109285964 A * | 1/2019 | ......... H01L 27/3244 |
| CN | 109285964 A | 1/2019 | |
| CN | 110224082 A | 9/2019 | |
| CN | 110473901 A | 11/2019 | |
| JP | 2011027822 A | 2/2011 | |

\* cited by examiner

FLEXIBLE DISPLAY PANEL, FLEXIBLE DISPLAY DEVICE, AND MANUFACTURING METHOD OF FLEXIBLE DISPLAY PANEL

FIELD OF INVENTION

The present invention relates to the field of display technologies, and in particular, to a flexible display panel, a flexible display device, and a manufacturing method of the flexible display panel.

BACKGROUND OF INVENTION

With the introduction of high-performance electronic products, flexible and bendable consumer electronics have attracted major manufacturers to invest and develop the products. In order to achieve dynamic bending display products, new materials, new designs, and new manufacturing processes must be introduced to improve the performance of flexible bendable display products.

Technical Problem

Biggest challenges for flexible bendable display products are flexible display panels. The flexible display panels replace surface glass in hard screens and are attached to outermost surfaces of displays. They need to have good bending resistance, scratch resistance, and high water resistance and an enhanced oxygen-barrier property. In the case of flexible display products with good bending resistance and flexibility, there will be disadvantages of being easily corroded by water and oxygen.

Technical Solution

The present invention provides a flexible display panel, a flexible display device, and a manufacturing method of the flexible display panel to solve a problem that flexible display panels are easily eroded by water and oxygen in the prior art.

In order to solve the above technical problem, a technical solution adopted in the present invention is to provide a flexible display panel. The flexible display panel is used as a protective cover of a flexible display device. The flexible display panel comprises a flexible substrate, organic pixel units, a first inorganic layer, a spacer, an organic layer, and a second inorganic layer. The organic pixel units are disposed in an array on a side of the flexible substrate. The first inorganic layer covers a side of the organic pixel units away from the flexible substrate. The spacer is disposed on a side of the first inorganic layer away from the flexible substrate, wherein the spacer is provided with a plurality of through holes. The second inorganic layer is disposed on a side of the spacer away from the flexible substrate.

In order to solve the above technical problem, another technical solution adopted in the present invention is to provide a flexible display device. The flexible display device comprises a housing and the above-mentioned flexible display panel.

In order to solve the above technical problem, another technical solution adopted in the present invention is to provide a manufacturing method of a flexible display panel. The manufacturing method comprises following steps of: forming organic pixel units in an array on a flexible substrate; coating and forming a first inorganic layer on the organic pixel units; laying a spacer with a plurality of through holes on the organic pixel units; coating and forming an organic layer contained in the plurality of through holes on the spacer; and coating and forming a second inorganic layer on the spacer.

Beneficial Effect

The beneficial effects of the present invention are: by providing a thin film sealing layer formed by a combination of a first inorganic layer, a second inorganic layer, and an organic layer, and a spacer disposed in the organic layer, thereby not only improving a flexibility of a flexible display panel but also improving ability of the flexible panel to block water and oxygen.

DETAILED DESCRIPTION OF PREFERRED EMBODIMENTS

The technical solution in the embodiments of the present invention will be clearly and completely described below with reference to the accompanying drawings in the embodiments of the present invention. It is to be understood that the described embodiments are merely exemplary of the invention, and not restrictive of the full scope of the invention. All other embodiments, which can be obtained by a person skilled in the art without inventive step based on the embodiments of the present invention, are within the scope of the present invention.

Reference herein to "an embodiment" means that a specific feature, structure, or characteristic described in connection with the embodiment can be included in at least one embodiment of the application. The appearances of the phrase in various places in the specification are not necessarily all referring to the same embodiment, nor are separate or alternative embodiments mutually exclusive of other embodiments. It is explicitly and implicitly understood by one skilled in the art that the embodiments described herein can be combined with other embodiments.

Figure 1:
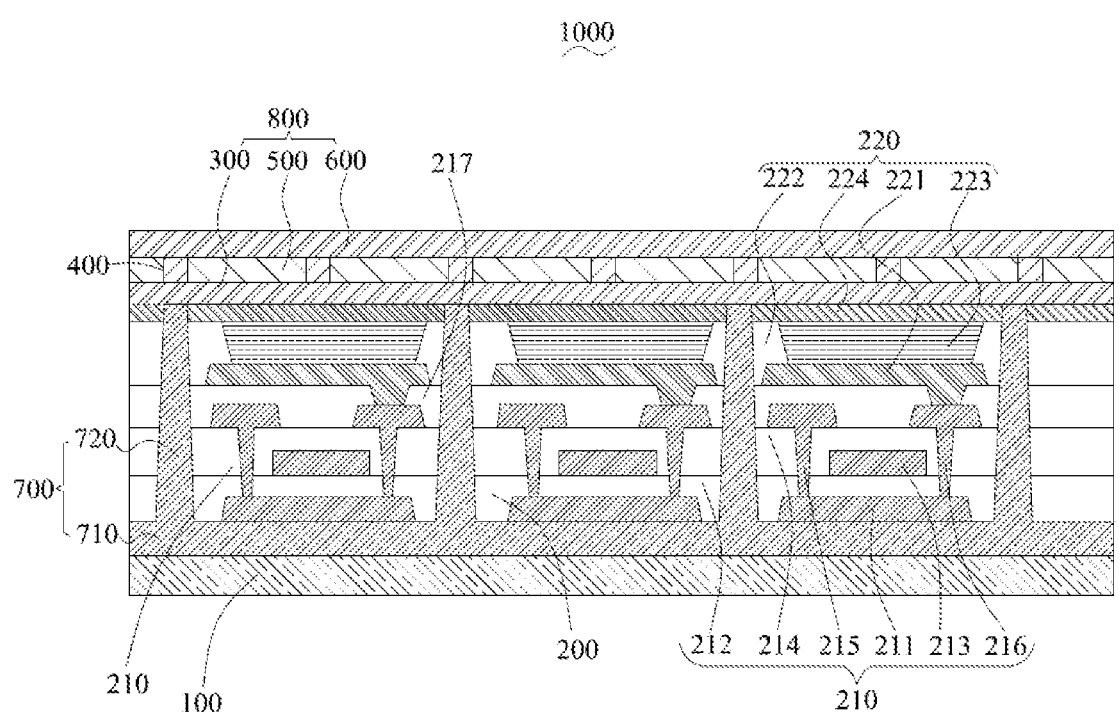
FIG. 1 is a schematic cross-sectional view of an embodiment of a flexible display panel provided by the present invention.

Please refer to FIG. 1, which is a schematic cross-sectional view of an embodiment of a flexible display panel 1000 provided by the present invention.

The present invention provides the flexible display panel 1000. The flexible display panel 1000 comprises a flexible substrate 100, organic pixel units 200, a first inorganic layer 300, a spacer 400, an organic layer 500, and a second inorganic layer 600.

The organic pixel units 200 are disposed in an array on a side of the flexible substrate 100. The first inorganic layer 300 covers a side of the organic pixel units 200 away from the flexible substrate 100. The spacer 400 is disposed on a side of the first inorganic layer 300 away from the flexible substrate 100, and the spacer 400 is provided with a plurality of through holes 410. The second inorganic layer 600 is disposed on a side of the spacer 400 away from the flexible substrate 100.

Specifically, the flexible substrate 100 may be a flexible substrate formed using polymer materials such as polyimide (PI), polycarbonate (PC), polyethersulfone (PES), polyethylene terephthalate (PET), polyethylene naphthalate (PEN), polyarylates (PAR), or glass fiber reinforced plastics (FRP) to make the flexible substrate 100 more flexible and more transparent. The organic layer 500 is disposed between the first inorganic layer 300 and the second inorganic layer 600. The organic layer 500, the first inorganic layer 300, and the second inorganic layer 600 are combined to form a thin film sealing layer 800. The first inorganic layer 300 and the second inorganic layer 600 can be used to block entry of water and oxygen from an external environment and further can protect the organic pixel unit 200. A buffer is disposed in the organic layer 500 to release stress from the first inorganic layer 300 and the second inorganic layer 600. The thin film sealing layer 800 is composed of the first inorganic layer 300, the second inorganic layer 600, and the organic layer 500 alternately, which makes the flexible display panel 1000 more flexible.

Materials of the first inorganic layer 300 and the second inorganic layer 600 may be silicon nitride (SiN), silicon oxide (SiOX), aluminum oxide ($Al_2O_3$), titanium oxide ($TiO_2$), or zirconium oxide ($ZrO_2$). The organic layer 500 may be a polymer transparent material, such as acrylic, polycarbonate-based polymer, and polystyrene to effectively relieve stress during a film formation of the inorganic layer.

The beneficial effects of the embodiment are: the first inorganic layer 300, the second inorganic layer 600, and the organic layer 500 are combined to form the thin film sealing layer 800, and the first inorganic layer 300, the second inorganic layer 600, and the organic layer 500 are laid alternately, thereby increasing flexibility of the entire film sealing layer 800 and achieving an effect of enhancing flexibility of the flexible display panel 1000. Meanwhile, the organic layer 500 in the thin film sealing layer 800 is composed of the first inorganic layer 300, the second inorganic layer 600, and the organic layer 500 is provided with the spacer 400, and the spacer 400 divides the organic layer 500 into a plurality of independent units. When a position where cracks appear in the first inorganic layer 300 and a position where cracks appear in the second inorganic layer 600 are not disposed in the same division unit at the same time, water and oxygen entering the organic layer 500 through the cracks of the second inorganic layer 600 will be blocked in the organic layer 500 by the spacer 400 and cannot enter the organic pixel unit 200 through the first inorganic layer 300. Therefore, the entire film sealing layer 800 and the spacer 400 work together to effectively improve flexibility of the entire flexible display panel. In addition, the spacer 400 supports the first inorganic layer 300 and the second inorganic layer 600, thereby improving stability of the thin film sealing layer 800.

Figure 2:
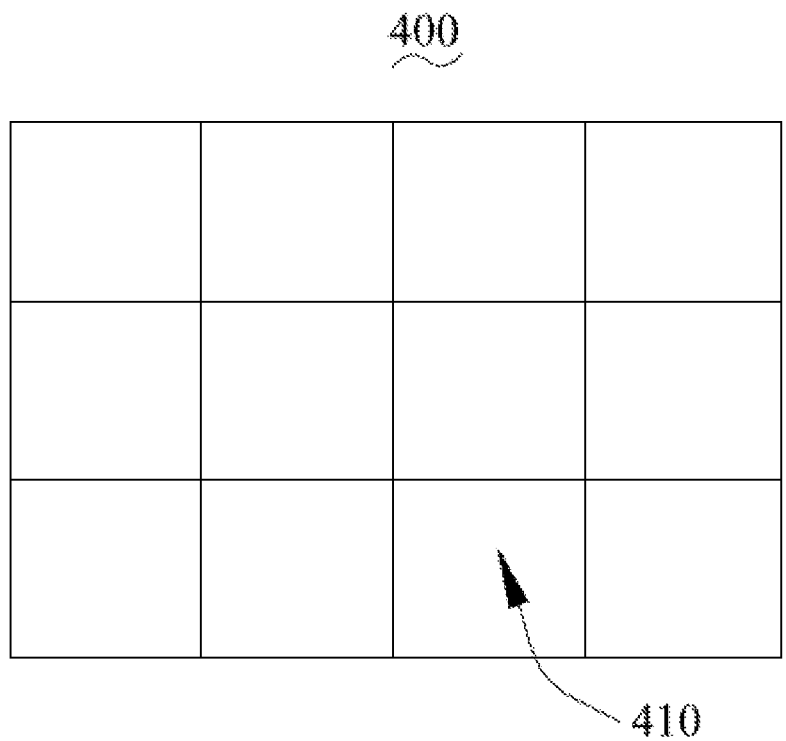
FIG. 2 is a schematic top view of an embodiment of a spacer provided by the present invention.

Please refer to FIG. 1 and FIG. 2. FIG. 2 is a schematic top view of an embodiment of the spacer 400 provided by the present invention.

The spacer 400 is disposed on the side of the first inorganic layer 300 away from the flexible substrate 100, and the spacer 400 is provided with the plurality of through holes 410, and the plurality of through holes 410 can be isolated from each other.

In one case, the plurality of through holes 410 provided by the spacer 400 are isolated from each other, and the plurality of through holes 410 divides the organic layer 500 into a plurality of independent units. Each unit is isolated from the surrounding environment to form multiple independent protective chambers, which are independent of each other. When the position where the cracks appear in the first inorganic layer 300 and the position where the cracks appear in the second inorganic layer 600 are not disposed in the same division unit at the same time, water and oxygen entering the organic layer 500 through the cracks of the second inorganic layer 600 will be blocked in the organic layer 500 by the spacer 400 and cannot enter the organic pixel unit 200 through the first inorganic layer 300. Therefore, it has multiple blocking effects on water and oxygen, which can improve ability of the flexible display panel 1000 to block water and oxygen.

Figure 3:
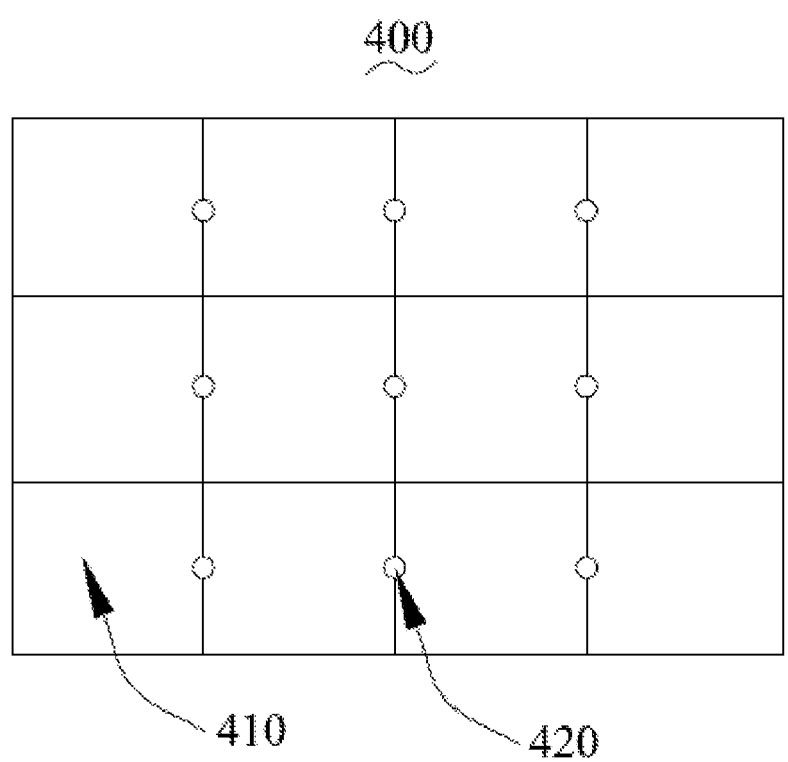
FIG. 3 is a schematic top view of another embodiment of the spacer provided by the present invention.

Please refer to FIG. 3. FIG. 3 is a schematic top view of another embodiment of the spacer 400 provided by the present invention.

In another case, the spacer 400 is provided with a plurality of through holes 410, and a connection hole 420 is provided on a side wall of each through hole 410. The plurality of through holes 410 divides the organic layer 500 into a plurality of independent units, and the plurality of independent units communicate with each other. During the folding process of the flexible display panel, the connection hole 420 effectively absorbs local stress, which makes the spacer 400 more foldable. Therefore, when the flexible display panel is folded by an external force, the spacer 400 can better withstand external forces. Furthermore, the flexibility of the flexible display panel 1000 can be improved.

A material of the spacer 400 may be glass, and the material of the spacer 400 may be ultra-thin glass with a thickness of 1 µm to 10 µm, such as 1 µm, 2 µm, 4 µm, 6 µm, or 10 µm. Specifically, the ultra-thin glass is a hard borate glass, which contains boron oxide in its composition and has characteristics of high light transmittance and good photoelectric performance. Simultaneously, the ultra-thin glass has an effect of blocking water vapor and oxygen, thereby improving water and oxygen blocking ability of the flexible display panel.

Figure 4:
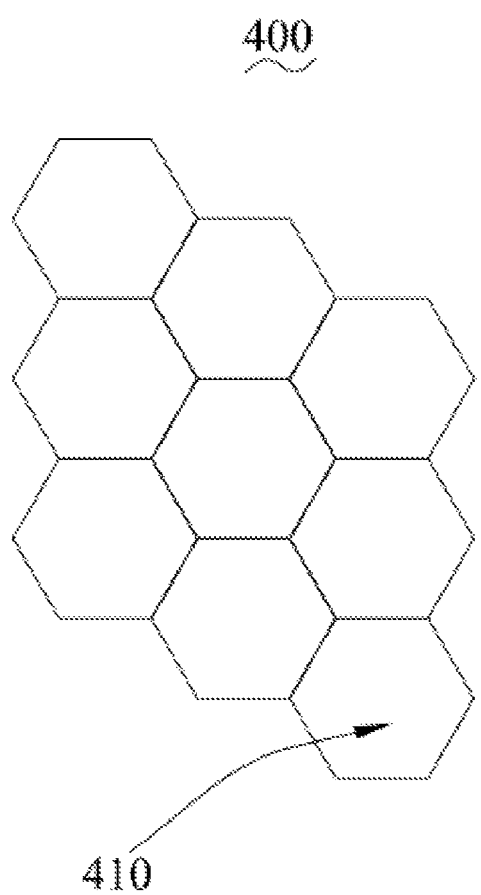
FIG. 4 is a schematic cross-sectional view of another embodiment of the spacer provided by the present invention.

Please refer to FIG. 4, which is a schematic cross-sectional view of an embodiment of the plurality of through holes 410 provided by the present invention.

A cross-sectional shape of the through hole 410 can be circular, square, or regular hexagonal shaped. For example, the cross-sectional shape of the through hole 410 may be hexagonal, and the hexagonal structure may make the single through hole 410 be better connected to make a better use of space. Simultaneously, the hexagonal structure can make the through hole 410 more uniformly stressed, thereby enhancing a release of external stress from the through hole 410. Of course, the cross-sectional shape of the through hole 410 may also have other regular or irregular shapes.

Please continue to refer to FIG. 1, which is the schematic cross-sectional view of the embodiment of the flexible display panel 1000 provided in the present invention.

The flexible display panel further comprises a water-oxygen barrier layer 700 disposed between the flexible substrate 100 and the organic pixel units 200. The organic pixel unit 200 comprises a thin film transistor 210 and an organic light emitting diode 220 electrically connected to each other. The thin film transistor 210 is formed on the water-oxygen barrier layer 700, and the organic light emitting diode 220 is disposed on the thin film transistor 210.

Specifically, a material of the water-oxygen barrier layer 700 between the organic pixel units 200 may be $Al_2O_3$, $TiO_2$, SiN, $SiO_2$, HMDSO, or polyester. Preferably, a thickness of the water-oxygen barrier layer 700 is from 10 nm to 100 nm, for example 10 nm, 30 nm, and 100 nm, thereby improving water and oxygen barrier ability of the flexible substrate 100.

The water-oxygen barrier layer 700 comprises a main body portion 710 and a plurality of spacer portions 720. The main body portion 710 is disposed between the flexible substrate 100 and the thin film transistor 210, and the plurality of spacer portions 720 are disposed on the main body portion 710 and pass through the thin film transistor 210 and the organic light emitting diode 220 to abut on the first inorganic layer 300. An organic light emitting diode 220 may be disposed between adjacent spacer portions 720, and a plurality of organic light emitting diodes 220 may also be disposed between adjacent spacer portions 720, such as two organic light emitting diodes 220 and three organic light emitting diodes 220, etc. The spacer portion 720 divides the organic light emitting diode 220 into a plurality of independent units, thereby preventing water and oxygen from further entering the organic light emitting diodes 220 of other units when entering the organic light emitting diodes 220 of one unit, causing second damage to the organic light emitting diodes 220. In addition, the spacer portions 720 support regions between the first inorganic layer 300 and the flexible substrate 100, thereby improving stability of the flexible display panel 1000.

A side tilt angle of the spacer portion 720 can be between 80° and 90°, thereby increasing the stability of the spacer portion 720. The lower ends of the plurality of spacer portions 720 may be integrated with the water and oxygen barrier layer 700. The spacer portion 720 and the water-oxygen barrier layer 700 are both made of an organic water-oxygen blocking material, thereby improving a water-oxygen barrier ability of the overall flexible display panel 1000.

Figure 5:
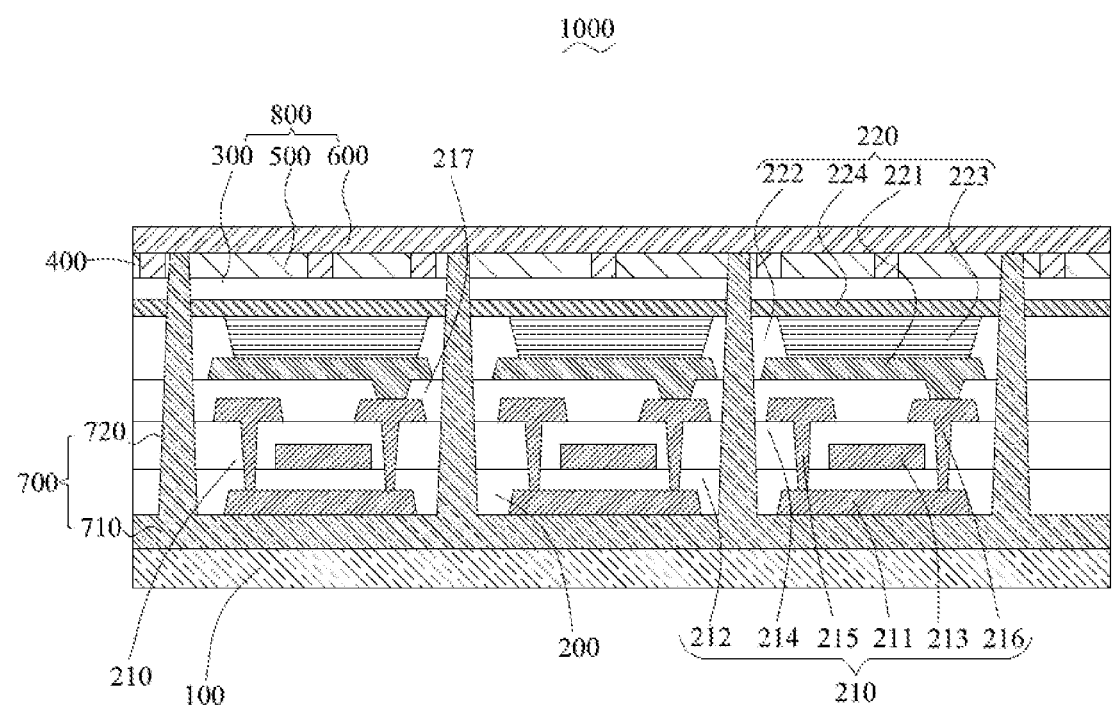
FIG. 5 is a schematic cross-sectional view of another embodiment of the flexible display panel provided by the present invention.

Please refer to FIG. 5, which is a schematic cross-sectional view of another embodiment of the flexible display panel 1000 provided by the present invention.

Furthermore, the plurality of spacer portions 720 are further disposed on the second inorganic layer 600, and the plurality of spacer portions 720 may further divide the organic layer 500 into a plurality of separate independent regions. Each independent region is independent of each other so that water and oxygen cannot move between different independent regions. When a position where cracks appear in the first inorganic layer 300 and a position where cracks appear in the second inorganic layer 600 are not disposed in the same independent region at the same time, water and oxygen entering the organic layer 500 through the cracks of the second inorganic layer 600 will be blocked by the spacer portion 720 in the organic layer 500 and unable to enter the organic pixel unit 200 through the first inorganic layer 300, so that the spacer 400 and the spacer portion 720 work together to increase ability of the flexible display panel 1000 to block water and oxygen.

The thin film transistor 210 comprises an active layer 211, an insulating layer 212, a gate electrode 213, an interlayer dielectric layer 214, a source electrode 215, a drain electrode 216, and a planarization layer 217. The active layer 211 is formed on the water-oxygen barrier layer 700. The gate insulating layer 212 covers the active layer 211. The gate electrode 213 is formed on the gate insulating layer 212. The interlayer dielectric layer 214 covers the gate electrode 213. The source electrode 215 and the drain electrode 216 are formed on the interlayer dielectric layer 214. The planarization layer 217 covers the source electrode 215 and the drain electrode 216. The organic light emitting diode 220 is disposed on a side of the planarization layer 217 away from the flexible substrate 100 and is electrically connected to the drain electrode 216 passing through the planarization layer 217.

The organic light emitting diode 220 comprises a first electrode 221, a pixel defining layer 222, an organic light emitting layer 223, and a second electrode 224. The first electrode 221 is formed on the thin film transistor 210 and is electrically connected to the thin film transistor 210. The pixel defining layer 222 covers the first electrode 221. The organic light emitting layer 223 is formed on the first electrode 221. The second electrode 224 is formed on the organic light emitting layer 223.

Figure 6:
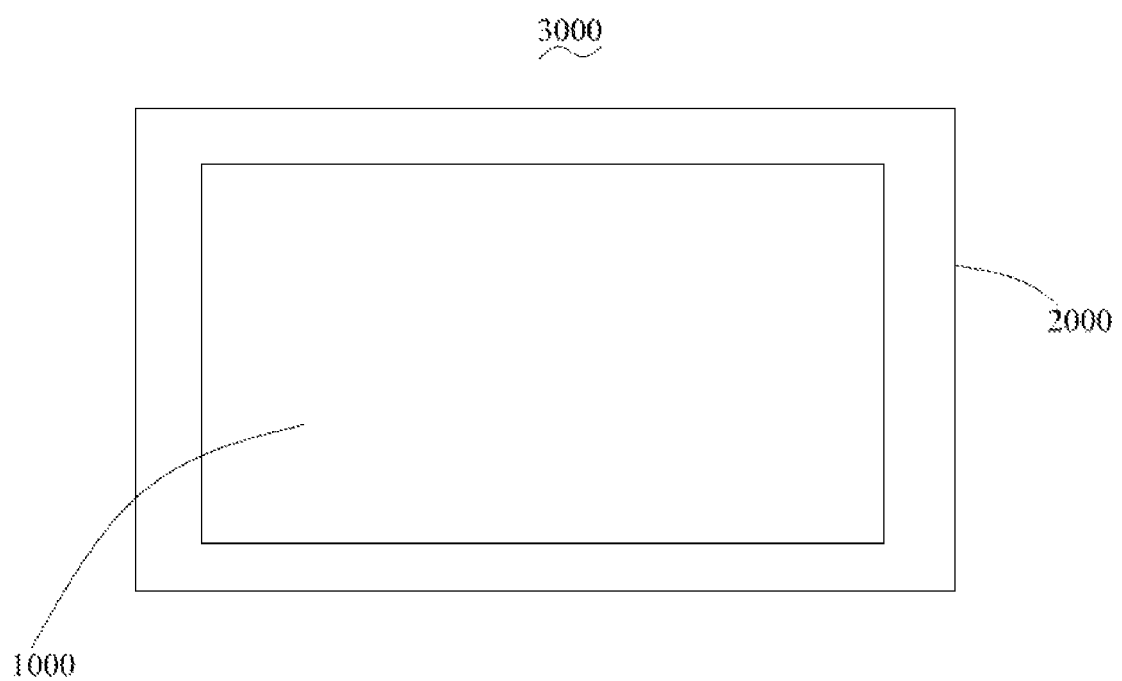
FIG. 6 is a schematic structural view of an embodiment of a flexible display device provided by the present invention.

Please refer to FIG. 6. FIG. 6 is a schematic structural view of an embodiment of a flexible display device 3000 provided by the present invention.

The flexible display device 3000 comprises a housing 2000 and the flexible display panel 1000 described in any of the above embodiments. The flexible display panel 1000 is connected to the housing 2000. The flexible display panel 1000 is detachably connected to the housing 2000, which facilitates the transportation and portability of the flexible display device 3000.

Figure 7:
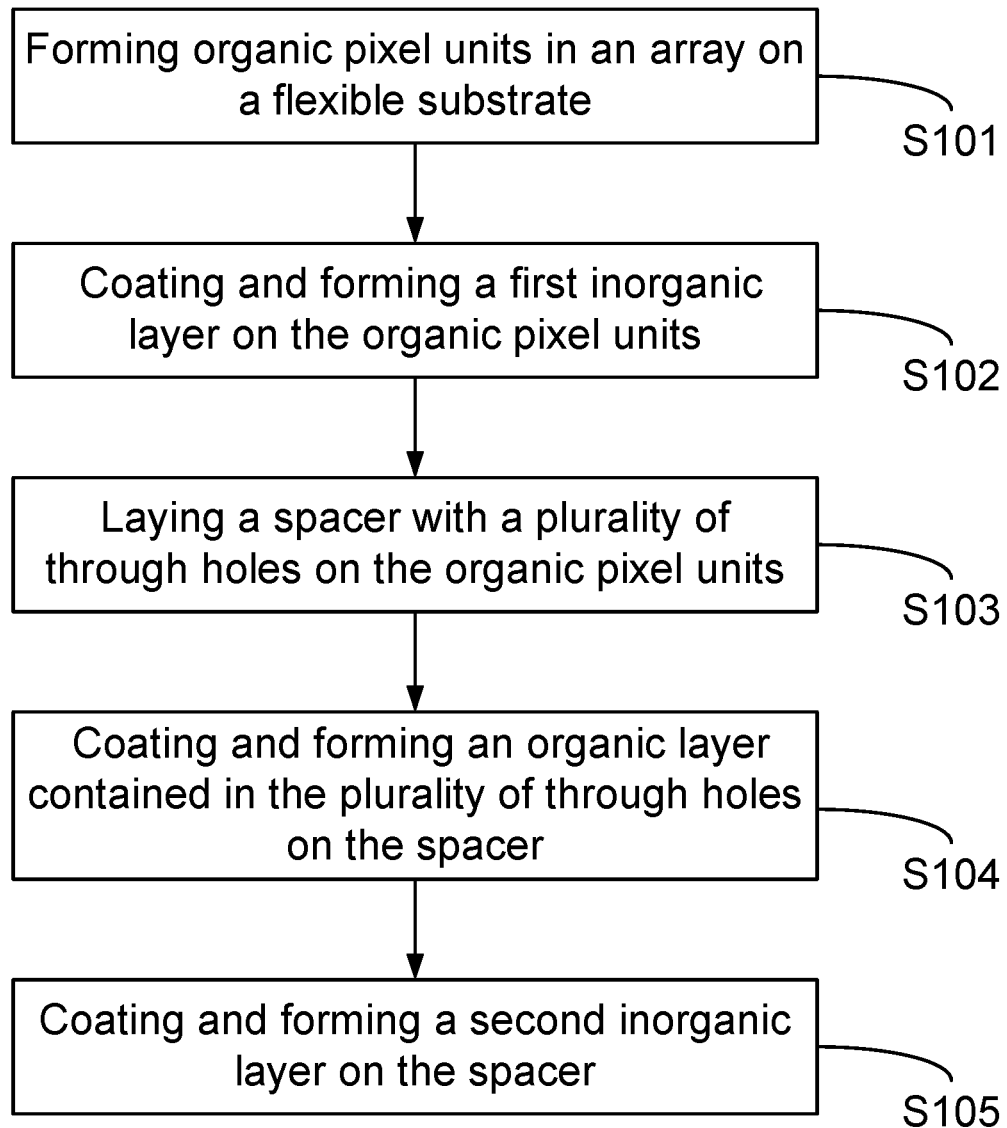
FIG. 7 is a schematic flowchart of an embodiment of a manufacturing method of the flexible display panel provided by the present invention.

Please refer to FIG. 1 and FIG. 7. FIG. 7 is a schematic flowchart of an embodiment of a manufacturing method of the flexible display panel 1000 provided in the present invention, which comprises following steps of:

S101, forming organic pixel units 200 in an array on a flexible substrate 100.

The flexible substrate 100 may be a flexible substrate formed by using polymer materials such as polyimide (PI), polycarbonate (PC), polyethersulfone (PES), polyethylene terephthalate (PET), polyethylene naphthalate (PEN), polyarylates (PAR), or glass fiber reinforced plastics (FRP) to make the flexible substrate 100 more flexible and more transparent. The organic pixel units 200 are formed in an array on the flexible substrate 100. The organic pixel units 200 are used for graphic display.

S102, coating and forming a first inorganic layer 300 on the organic pixel units 200.

The first inorganic layer 300 is formed by coating on the organic pixel unit 200 to encapsulate the organic pixel units 200 and prevent the organic pixel units 200 from contacting water and oxygen. A material of the first inorganic layer 300 may be silicon nitride (SiN), silicon oxide (SiOX), aluminum oxide ($Al_2O_3$), titanium oxide ($TiO_2$), or zirconia ($ZrO_2$).

S103. laying the spacer 400 with a plurality of through holes 410 on the organic pixel units 200.

S104, coating and forming an organic layer 500 contained in the plurality of through holes 410 on the spacer 400.

The spacer 400 with the plurality of through holes 410 is laid on the organic pixel units 200, and the organic layer 500 contained in the plurality of through holes 410 is further formed on the spacer 400 by coating. The spacer 400 with the plurality of through holes 410 divides the organic layer 500 into a plurality of independent units. The organic layer 500 may be a polymer transparent material, such as acrylic, polycarbonate-based polymer, and polystyrene so as to effectively relieve the stress during the film formation of the inorganic layer.

S105, coating and forming a second inorganic layer 600 on the spacer 400.

The second inorganic layer 600 is formed by coating on the spacer 400 to further encapsulate the organic pixel unit 200 to prevent the organic pixel unit 200 from contacting water and oxygen. A material of the second inorganic layer 600 may be silicon nitride (SiN), silicon oxide (SiOX), aluminum oxide ($Al_2O_3$), titanium oxide ($TiO_2$), or zirconia ($ZrO_2$).

The first inorganic layer 300, the second inorganic layer 600, and the organic layer 500 are combined to form the thin film sealing layer 800, and the first inorganic layer 300, the second inorganic layer 600, and the organic layer 500 are laid alternately, thereby increasing a flexibility of the entire film sealing layer 800 and achieving an effect of enhancing a flexibility of the flexible display panel 1000. Meanwhile, the organic layer 500 in the thin film sealing layer 800 composed of the first inorganic layer 300, the second inorganic layer 600, and the organic layer 500 is provided with the spacer 400, and the spacer 400 divides the organic layer 500 into a plurality of independent units. When a position where cracks appear in the first inorganic layer 300 and a position where cracks appear in the second inorganic layer 600 are not disposed in the same division unit at the same time, water and oxygen entering the organic layer 500 through the cracks of the second inorganic layer 600 will be blocked in the organic layer 500 by the spacer 400 and cannot enter the organic pixel unit 200 through the first inorganic layer 300. Therefore, the entire film sealing layer 800 and the spacer 400 work together to effectively improve the flexibility of the entire flexible display panel 1000. In addition, the spacer 400 supports the first inorganic layer 300 and the second inorganic layer 600, thereby improving a stability of the thin film sealing layer 800.

A material of the spacer 400 may be glass, and the material of the spacer 400 may be ultra-thin glass with a thickness of 1 μm to 10 μm, such as 1 μm, 2 μm, 4 μm, 6 μm, or 10 μm. Specifically, the ultra-thin glass is a hard borate glass, which contains boron oxide in its composition and has characteristics of high light transmittance and good photoelectric performance. Simultaneously, the ultra-thin glass has an effect of blocking water vapor and oxygen, thereby improving the water and oxygen blocking ability of the flexible display panel 1000.

A cross-sectional shape of the through hole 410 can be circular, square, or regular hexagonal shaped. For example, the cross-sectional shape of the through hole 410 may be hexagonal, and the hexagonal structure may make the single through hole 410 be better connected to make a better use of space. Simultaneously, the hexagonal structure can make the through hole 410 more uniformly stressed, thereby enhancing a release of external stress from the through hole 410. Of course, the cross-sectional shape of the through hole 410 may also have other regular or irregular shapes.

The manufacturing method of the present invention can form the flexible display panel 1000 in any preceding embodiment, which will not be enumerated.

The above is only an implementation of the present invention, and thus does not limit the patent scope of the present invention. Any equivalent structure or equivalent process transformation made by using the contents of the specification and drawings of the invention, or directly or indirectly used in other related technical fields, is equally included in the scope of patent protection of the invention.

What is claimed is:

1. A flexible display panel, comprising:
   a flexible substrate;
   organic pixel units disposed in an array on a side of the flexible substrate;
   a first inorganic layer covering a side of the organic pixel units away from the flexible substrate;
   a spacer disposed on a side of the first inorganic layer away from the flexible substrate, wherein the spacer is provided with a plurality of through holes;
   an organic layer disposed on the side of the first inorganic layer away from the flexible substrate and contained in the plurality of through holes; and
   a second inorganic layer disposed on a side of the spacer away from the flexible substrate;
   wherein a material of the spacer is glass.

2. The flexible display panel as claimed in claim 1, wherein the plurality of through holes are isolated from each other.

3. The flexible display panel as claimed in claim 1, wherein a cross-sectional shape of the through holes is circular, square, or regular hexagonal shaped.

4. The flexible display panel as claimed in claim 1, further comprising a water-oxygen barrier layer disposed between the flexible substrate and the organic pixel units, wherein the organic pixel units comprise a thin film transistor and an organic light emitting diode electrically connected to each other, the thin film transistor is formed on the water-oxygen barrier layer, and the organic light emitting diode is disposed on the thin film transistor.

5. The flexible display panel as claimed in claim 4, wherein the water-oxygen barrier layer comprises a main body portion and a plurality of spacer portions, the main body portion is disposed between the flexible substrate and the thin film transistor, and the plurality of spacer portions are disposed on the main body portion and pass through the thin film transistor and the organic light emitting diode to abut on the first inorganic layer.

6. The flexible display panel as claimed in claim 4, wherein the thin film transistor comprises an active layer, an insulating layer, a gate electrode, an interlayer dielectric layer, a source electrode, a drain electrode, and a planarization layer, the active layer is formed on the water-oxygen barrier layer, the gate insulating layer covers the active layer, the gate electrode is formed on the gate insulating layer, the interlayer dielectric layer covers the gate electrode, the source electrode and the drain electrode are formed on the interlayer dielectric layer, the planarization layer covers the source electrode and the drain electrode, and the organic light emitting diode is disposed on a side of the planarization layer away from the flexible substrate and is electrically connected to the drain electrode passing through the planarization layer.

7. The flexible display panel as claimed in claim 4, wherein the organic light emitting diode comprises a first electrode, a pixel defining layer, an organic light emitting layer, and a second electrode, the first electrode is formed on the thin film transistor and is electrically connected to the thin film transistor, the pixel defining layer covers the first electrode, the organic light emitting layer is formed on the first electrode, and the second electrode is formed on the organic light emitting layer.

8. A flexible display device, comprising:
   a housing and a flexible display panel, wherein the flexible display panel is connected to the housing, and the flexible display panel comprises:
   a flexible substrate;
   organic pixel units disposed in an array on a side of the flexible substrate;
   a first inorganic layer covering a side of the organic pixel units away from the flexible substrate;

a spacer disposed on a side of the first inorganic layer away from the flexible substrate, wherein the spacer is provided with a plurality of through holes;

an organic layer disposed on the side of the first inorganic layer away from the flexible substrate and contained in the plurality of through holes; and a second inorganic layer disposed on a side of the spacer away from the flexible substrate;

wherein a material of the spacer is glass.

9. The flexible display device as claimed in claim 8, wherein the plurality of through holes are isolated from each other.

10. The flexible display device as claimed in claim 8, wherein a cross-sectional shape of the through holes is a circular, a square, or a regular hexagonal shaped.

11. The flexible display device as claimed in claim 8, wherein the flexible display panel further comprises a water-oxygen barrier layer disposed between the flexible substrate and the organic pixel units, the organic pixel units comprise a thin film transistor and an organic light emitting diode electrically connected to each other, the thin film transistor is formed on the water-oxygen barrier layer, and the organic light emitting diode is disposed on the thin film transistor.

12. The flexible display device as claimed in claim 11, wherein the water-oxygen barrier layer comprises a main body portion and a plurality of spacer portions, the main body portion is disposed between the flexible substrate and the thin film transistor, and the plurality of spacer portions are disposed on the main body portion and pass through the thin film transistor and the organic light emitting diode to abut on the first inorganic layer.

13. The flexible display device as claimed in claim 11, wherein the thin film transistor comprises an active layer, an insulating layer, a gate electrode, an interlayer dielectric layer, a source electrode, a drain electrode, and a planarization layer, the active layer is formed on the water-oxygen barrier layer, the gate insulating layer is covers on the active layer, the gate electrode is formed on the gate insulating layer, the interlayer dielectric layer covers the gate electrode, the source electrode and the drain electrode are formed on the interlayer dielectric layer, the planarization layer covers the source electrode and the drain electrode, and the organic light emitting diode is disposed on a side of the planarization layer away from the flexible substrate and is electrically connected to the drain electrode passing through the planarization layer.

14. The flexible display device as claimed in claim 11, wherein the organic light emitting diode comprises a first electrode, a pixel defining layer, an organic light emitting layer, and a second electrode, the first electrode is formed on the thin film transistor and is electrically connected to the thin film transistor, the pixel defining layer covers the first electrode, the organic light emitting layer is formed on the first electrode, and the second electrode is formed on the organic light emitting layer.

* * * * *